July 1, 1958 L. A. HOROWITZ 2,841,655

STABILIZED HIGH FREQUENCY AMPLIFIER CIRCUITS

Filed Dec. 6, 1956

INVENTOR.

Leopold A. Horowitz

BY

H. E. Newton

ATTORNEY.

2,841,655

STABILIZED HIGH FREQUENCY AMPLIFIER CIRCUITS

Leopold A. Horowitz, Erlton, N. J., assignor to Radio Corporation of America, a corporation of Delaware Application December 6, 1956, Serial No. 626,635

8 Claims. (Cl. 179—171)

Figures 1, 2A, 2B, 3, 4:
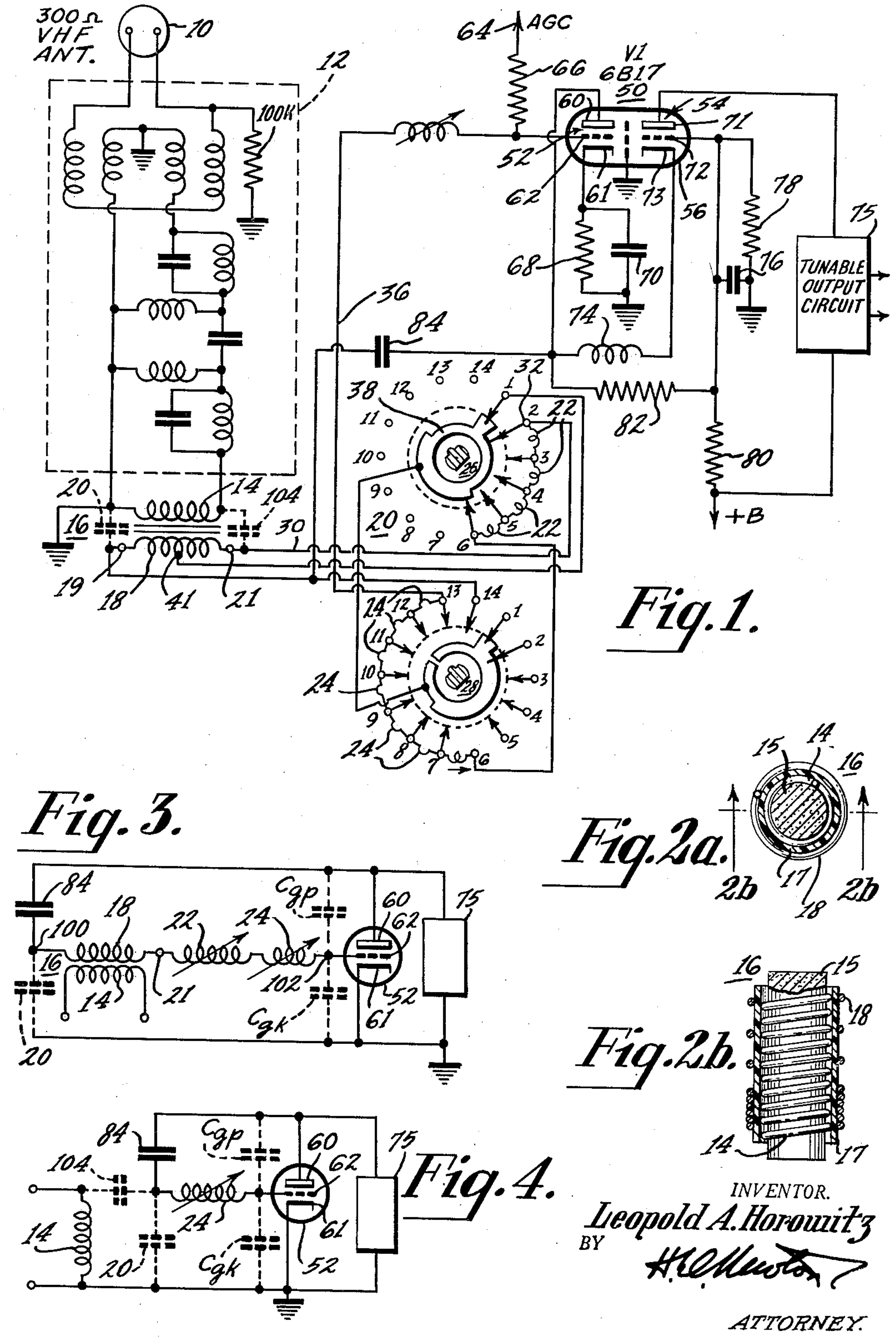

This invention relates to high frequency amplifier circuits, and more particularly relates to the neutralization circuits for radio frequency amplifiers which are tunable over a wide range of signal frequencies.

Triode amplifier tubes are extensively used in radio frequency (R. F.) amplifier circuits for television receivers or the like because of their superior signal-to-noise characteristics. Most triode amplifier circuits, however, require some form of neutralization circuit to counteract the effects caused by amplified output energy being fed back into the input circuit through the grid-plate capacitance of the tubes.

Certain types of triode amplifier circuits such as a grounded-cathode stage driving a grounded-grid stage which is popularly known as a "cascode" circuit does not require neutralization to prevent the amplifier stage from oscillating. However, if the operating potentials of the stage are changed such as by changes in an automatic gain control (AGC) potential, the feedback through the grid-plate capacitance of the grounded-cathode stage will change. This change in feedback causes a variation in the input admittance of the amplifier which in turn detunes the input circuit thereby producing a variation in the band-pass characteristic of the amplifier. Although these effects may be tolerated in certain instances, it has been found that for some applications such as color television, it is preferable or necessary to reduce or eliminate any such detuning effects insofar as possible.

In R. F. amplifiers which are tunable over a wide frequency spectrum such as the television band, it is particularly difficult to provide effective neutralization at all frequencies without requiring additional circuit elements for the individually neutralizing over different portions of the frequency spectrum to be tuned. In addition to the additional circuit elements, some form of switching means is required to selectively connect these circuit elements in the neutralizing circuit simultaneously with the tuning of the amplifier. Such systems not only add to the cost of the apparatus, but require additional space for the circuit elements and switches thereby resulting in an increased size of the apparatus in which the amplifier is used.

It is an object of this invention to provide an improved radio frequency amplifier stage which is tunable over a wide frequency spectrum wherein the input admittance of the stage at any frequency in said spectrum is stabilized against changes due to variations in automatic gain control potential applied to said stage.

Another object of this invention is to provide an improved neutralization circuit for a radio frequency amplifier tunable over a range of high frequencies which provides effective neutralization of the amplifier over the entire range of frequencies without requiring a plurality of additional neutralizing circuit elements and additional switches for selectively connecting the neutralizing circuit elements in the amplifier circuit.

In accordance with the invention, signals to be amplified are fed to a tunable amplifier circuit through a signal coupling transformer. The distributed capacitance between the primary and secondary windings of the coupling transformer, together with interelectrode capacities of the tube and a neutralizing capacitor, form a bridge circuit for neutralizing the amplifier over the lower portion of the band of frequencies in which the amplifier is tunable.

For neutralization over the higher portion of the frequency band, the transformer secondary is shorted out and signals are fed to the amplifier circuit through a capacity voltage divider formed by the distributed capacitance between the primary and secondary windings of the transformer. Neutralization of the amplifier is provided by a circuit including the variable tuning inductor for the amplifier, which in addition to tuning the amplifier input circuit to the desired frequency, cooperates with the neutralizing capacitor to derive a voltage from the plate circuit and apply it to the grid circuit 180° out of phase with the voltage which is fed back to the grid circuit through the inherent grid-plate capacitance. As the inductance value of the inductor is changed for tuning the amplifier circuit to the desired frequencies, it also adjusts the neutralization circuit maintaining the neutralization voltage at the proper value.

The novel features that are considered characteristic of this invention are set forth with particularity in the appended claims. The invention itself, however, both as to its organization and method of operation, as well as additional objects and advantages thereof will best be understood from the following description when read in connection with the accompanying drawing, in which:

Figure 1 is a schematic circuit diagram of an R. F. amplifier for a very-high-frequency (V. H. F.) television receiver embodying the neutralization circuit of the invention;

Figures 2*a* and 2*b* are top and sectional views respectively of an input transformer used in conjunction with the neutralizing circuit of the invention;

Figure 3 is a simplified schematic A. C. diagram of the high frequency amplifier shown in Figure 1 when tuned near the low frequency end of the tuning range; and Figure 4 is a simplified schematic A. C. circuit diagram of the high frequency amplifier shown in Figure 1 when tuned near the high frequency end of the tuning range.

Referring now to the drawings wherein like reference numerals will be used to designate the same components throughout the various figures thereof, and particularly to Figure 1, the high frequency amplifier circuit is adapted to select any one of the twelve very high frequency (V. H. F.) television channels which have been assigned frequencies in the range of 54–88 megacycles for channels 2–6, and 174–216 megacycles for channels 7–13. A suitable signal source such as an antenna is connected to an input terminal board 10. Received V. H. F. television input signals applied to the input terminal board 10 are passed through an elevator transformer and suitable traps or interference attenuation circuits found within the shielded compartment 12, to the primary winding 14 of an input transformer 16.

The primary winding 14 is inductively coupled to a tapped secondary winding 18 having a terminal 19 which is connected to ground by way of the distrbuted capacity 20 between the windings. The other terminal 21 of the secondary winding 18 is connected to the input electrode of an R. F. amplifier stage through a plurality of tuning inductors 22 and 24 on the switch sections 26 and 28 respectively.

The construction of the input transformer 16 may best be seen by reference to Figure 2. The primary winding 14 of the transformer is wound directly on a molded powdered iron core 15. The turns of the primary winding 14 are uniformly spaced over the entire length of the core 15, and are separated from the secondary windings 18 by a coil form or layer of insulating material 17. The secondary winding 18 which is coaxially positioned with respect to the primary winding 14 comprises a few spaced turns near one end of the core, but the majority of the secondary turns are closely wound and positioned adjacent the end of the primary winding which is to be connected to ground. The distance of the closely wound turns from the end of the core 15 is determined by the necessary coefficient of coupling. The distributed capacity 20 which is shown in Figure 1 as connecting the terminal 19 of the secondary winding 18 to ground is primarily the capacitance between the closely spaced turns of the secondary winding 18, and the adjacent turns of the primary winding 14.

One type of input transformer found to give excellent results in the neutralization circuit of the invention included a core of powdered iron having good frequency characteristics up to about 100 mc. ⅝ inch in length and $\frac{3}{16}$ inch in diameter. The primary winding comprised 10 evenly spaced turns of No. 34 wire wound directly on the core, and the secondary winding comprised three spaced and six closely wound turns of No. 34 wire. The closely wound turns were spaced a mean distance of $\frac{3}{16}$ inch from the end of the core. Naturally the other transformer parameters may be used without departing from the spirit of the invention.

Referring further to Figure 1, the circuit from the terminal 21 of the secondary winding 18 to the input electrode of the R. F. amplifier stage may be traced by following the conductor 30 from the terminal 21 on the secondary winding 18 to a terminal 32 located on the switch section 26, through the inductors 22, the conductor 34, the inductors 24 and the conductor 36 to the amplifier tube.

The switch sections 26 and 28 are wafer switches having individual inductors connected between the terminals thereof where schematically indicated. These switch sections 26 and 28, which may comprise opposite sides of the same wafer, are provided with rotor elements 38 and 40 respectively which are adapted to short out successive portions of the inductors 22 and 24 to tune the amplifier input circuit to the desired television channel. The rotor elements 38 and 40 are movable by steps to any of 13 different positions, 12 V. H. F. television channel positions and 1 U. H. F. position. As indicated in Figure 1 the tuner is in the U. H. F. position and by rotation of the rotors one step in a clockwise direction the input circuit would be tuned to channel 2. Further rotation in a clockwise direction would successively select channels 2–13.

The secondary winding 18 of the input transformer 16 is provided with a tap 41 which is connected to a contact terminal on the switch section 26. For tuning the television channels 2, 3 and 4 the center tap is not connected in circuit. However, in tuning channels 5 and 6 the tap 41 is connected to the terminal 21 to short out a portion of the secondary winding 18. This aids in maintaining the bandwidth constant over the frequency range, and the remaining windings provide the necessary coupling and distributed capacity.

The use of the iron core in the transformer 16 is undesirable on the high channels 7–13, because of the losses that available irons exhibit at high frequencies. Therefore, when the switch sections 26 and 28 are switched to channel 7, the entire secondary winding 18 is shorted out, and the distributed capacity between the primary winding 14 and the secondary winding 18 forms a voltage divider input circuit as will hereinafter be explained.

The R. F. amplifier stage inncludes a dual triode tube 50 which includes a grounded cathode stage driving a grounded grid stage. The separate stages each include a separate triode tube 52 and 54 respecttively which may be included in the single tube envelope shown for the tube 50. This may, for example, be a commercial type 6BQ7A tube, and include an internal shield 58 to aid in the isolation of the separate tube sections.

The tube 52 is connected as a grounded cathode amplifier and includes an anode 60, a cathode 61 and a control grid 62. An AGC bias potential is applied to the control grid 62 from an AGC supply terminal 64 by way of a series resistor 66. A cathode bias resistor 68 is connected between the cathode 61 and ground to provide additional bias for the tube 52. The cathode 61 is essentially grounded for signal frequencies by a signal-bypass capacitor 70.

The tube 54 includes an anode 71, a cathode 72 and a control grid 73. Coupling is provided between the tubes 52 and 54 by an inductor 74 which is on the order of .15 microhenry and is connected between the anode 60 of the first triode tube 52 and the cathode 73 of the second triode tube 54. The inductor 74 series resonates with the input capacitance of the second triode tube 54 which is on the order of 5 micromicrofarads, and presented between the cathode 73 and the ground. The input capacitance of the triode 54 may be supplemented by additional external capacitance if necessary. The frequency of resonance of this series resonant circuit is preferably wthin the signal pass-band of the driven grounded grid amplifier although the circuit is operable if the resonance occurs slightly above the band of frequencies to be amplified. For television receivers adapted to the present United States standards, it is found that optimum performance is obtained when the series resonant circuit is made resonant at the high end of the band, or about channel 13. The series resonant circuit is effective through a rather broad band of frequencies including the high band channels 7 to 13 because of the loading presented by the inherently low input impedance of the second triode section 35.

The triode 54 is connected to operate as a grounded-grid amplifier, and to this end the grid 72 is maintained at signal ground potential by a capacitor 76 which offers low impedance to signal frequency currents. Grid bias is obtained for the grounded grid triode 54 from the junction of a pair of resistors 78 and 80 which form a voltage divider network between ground and the +B voltage supply terminal. The resistors 78 and 80 are proportioned so that the voltage on the grid 72 is on the order of one half the anode supply voltage of the triode 54. A grid return resistor 82 connects the grid 72 of the triode 54 effectively to its cathode 73 at the anode 60 of the grounded cathode triode 52, since the inductor 74 has negligible impedance for direct current voltages. This connection may be made directly at the cathode 73 if desired. However, for operation at high frequency, output to input coupling should be kept as low as possible and the most convenient circuit connection is chosen to provide best overall operation. A tunable output circuit 75 is connected between the anode 71 of the tube 54 and a source of operating potential +B. If desired the output circuit may be coupled with a mixer stage or another R. F. amplifier stage.

The resistors 80 and 82 and the tube 52 form a second voltage divider network which has the effect of providing a remote cutoff characteristic for the driven grounded-grid amplifier, which is obtained by proper selection of the voltage divider components. In the present amplifier the resistance values used for the resistors 78 and 80 are 1 megohm, and the resistor 82 is 100,000 ohms. This circuit enables optimum R. F. amplifier operation without necessitating a high AGC voltage or producing cross modulation due to a sharp cutoff characteristic.

For certain applications, a driven grounded-grid amplifier of the type described above produces satisfactory operation while using only a minimum of components, and does not require neutralization for stability from oscillation or noise purposes. This is because the grounded-cathode stage has about unity gain, and therefore, the effects of the feedback through the anode to grid capacitance are relatively small. However, when the AGC potential changes with signal strength, the amount of feedback through the grid-anode capacitance changes thereby producing a variation in the input admittance of the amplifier. Although these effects can be tolerated in certain applications, it has been found that for some applications such as for color television, it is necessary to reduce any such detuning effects insofar as possible.

To this end, a neutralizing capacitor 84 is connected from the anode 60 of the tube 52 to the terminal 19 of the secondary winding 18. The combination of the neutralizing capacitor 84, the grid plate interelectrode capacitance $C_{gp}$, the grid cathode interelectrode capacitance $C_{gk}$ of the tube 52, and the distributed capacitance 20 between the primary and secondary windings of the transformer 16, forms a capacity bridge circuit for neutralizing this amplifier stage for channels 2–6.

An A. C. diagram of the R. F. amplifier stage 60 illustrating the capacity bridge circuit is shown in simplified form in Figure 3. One diagonal of the bridge circuit extends between the anode 60 and the cathode 61 of the amplifier tube 52. The secondary winding 18 and the tuning inductors 22 and 24 are connected in series across the other diagonal of the bridge between the terminals 100 and 102, the terminal 102 being connected to the control grid 62. The conditions for balance are when:

$$\frac{C_{84}}{C_{20}}=\frac{C_{gp}}{C_{gk}}$$

The output potential for the amplifier is taken across the first diagonal of the bridge or from plate 60 to ground. Thus, when the bridge is balanced, the terminals 100 and 102 of the bridge are equal potential points, and no voltage can exist across the terminals 100 and 102 due to potentials on the plate of an amplifier. This means that changes in the signal potential on the anode due to AGC potential changes or the like, does not change the input admittance of the amplifier stage, and accordingly does not detune the input circuit. The simplicity of the circuit will be realized when it is noted that the capacitor 84 is the only element required in addition to the elements already comprising the input circuit. Furthermore, the other three capacitances of the bridge circuit comprise interelectrode or distributed capacitance and are not physically added in the circuit as capacitors.

As mentioned above, the use of an iron core in a transformer on the channels in the upper V. H. F. band is undesirable because of the losses that available irons exhibit at high frequencies. Accordingly, the entire secondary winding 18 of the input transformer is shorted out for tuning the input circuit to channels 7–13.

Referring to Figure 2*b* along with Figure 1, the distributed capacity between the windings of the transformer 16 may be conveniently divided into two components; a first capacity 104 primarily between the primary winding 14 and the three spaced turns of the secondary winding 18; and the secondary capacity 20 primarily between the primary winding 14 and the six closely wound turns of the secondary winding 18. These capacities form a voltage dividing input network which is shown in the simplified A. C. diagram of Figure 4. As illustrated in Figure 4, for tuning over the range of frequencies assigned to channels 7–13, the signal input voltage is applied across the capacitance 20, rather than across the diagonal of the capacitance bridge which is connected to the control grid 62 of the R. F. amplifier stage as was the case for channels 2–6. Selected portions of the inductors 24 are connected in circuit between the control grid 62 and the junction of the voltage divider formed by the distributed capacitances 20 and 104. It can be noted that for tuning channels 7–13, the inductors 22 are shorted out, and therefore are effectively out of the circuit.

In addition to tuning the amplifier input circuit to the desired frequency, the inductors 24 and the capacitor 84 derive a signal from the plate circuit which is fed back to the control grid 62, 180° out of phase with the voltage fed back through the grid-plate capacitance $C_{gp}$. The amplitude of the voltage fed back through the capacitor 84—inductor 24 is adjusted to neutralize the amplifier by proper selection of the circuit elements.

The phase reversal will be understood by observing that the output voltage of the amplifier is impressed across the series circuit comprising the capacitor 84, the inductors 24 and the grid-cathode capacitance $C_{gk}$. The voltage across the capacitive elements of this series circuit is 180° out of phase with the voltage across the inductors 24. If the series combination resonates above the signal frequency, the impedance thereof will appear inductive, and the voltage across the inductors 24 will be in phase with the plate voltage, and the voltage across the capacitive elements will be 180° out of phase with the plate voltage. The neutralizing voltage appearing across the grid-cathode capacitance due to this circuit is 180° out of phase with regenerative feedback voltage due to the circuit including the grid plate capacitance $C_{gp}$. The magnitude of the neutralizing voltage may be varied by changing the ratio of inductive to capacitive reactance of the circuit.

Since the inductors 24 are common to the neutralization circuit and to the input circuit, tuning to successively higher channels simultaneously adjusts the inductance to provide proper neutralization of the amplifier individual to each of the channels 7–13 frequencies.

The tunable high frequency amplifier circuit described provides stable operation over a wide range of frequencies in that changes in AGC potential do not detune the input circuit thereof. The neutralization circuit for the amplifier is extremely simple in that a single fixed capacitor is the only element required in addition to the elements used in the tunable input circuit of the amplifier.

What is claimed is:

1. A high frequency signal amplifier tunable over a relatively wide frequency range comprising in combination, a triode amplifier tube having an anode, a cathode and a control grid, means providing an input circuit for said amplifier including a coupling transformer having coaxial primary and secondary windings and a ferromagnetic core, the turns of said primary winding being uniformly spaced along said core and connected between ground for the amplifier and a signal input terminal, the major portion of the turns of said secondary winding being near one end thereof and positioned adjacent the ground end of said primary winding, a tuning inductor connected between the other end of said secondary winding and said control grid, a signal output circuit for said amplifier connected between said anode and said ground, means connecting said cathode to ground, a neutralizing capacitor connected from said anode to said one end of said secondary winding and providing a ratio of neutralizing capacitance to distributed capacitance between the major portion of said secondary winding and said primary winding substantially equal to the ratio of grid-anode interelectrode capacitance to grid-cathode interelectrode capacitance of said amplifier tube, said capacitances being connected to provide a balanced bridge circuit between said anode and ground and having equipotential points with respect to signal potentials developed on said anode, said secondary winding and said tuning inductor being connected in a series circuit between said equipotential points, and means for tuning said amplifier in an upper portion of said frequency range and shorting said secondary winding to provide in said input circuit a capacitive voltage divider comprising the distributed capacitance between said transformer windings, said neutralizing capacitor and said tuning inductor connected to derive signal voltage from said output circuit in opposite phase and equal amplitude to the voltage fed back to said input circuit through the grid-anode interelectrode capacitance of said tube.

2. A high frequency amplifier tunable over a wide range of high frequencies comprising, in combination, an amplifier tube having an anode, cathode and control grid; signal input circuit means for said amplifier including a transformer having a primary and a secondary winding; a tuning inductor for said amplifier connected between said control grid and one end of said secondary winding; means providing a capacity bridge circuit for neutralizing said amplifier; said bridge circuit means including a neutralizing capacitor connected between said anode and the other end of said secondary winding, the distributed capacitance between the windings of said transformer, and the interelectrodal capacitances of said amplifier tube, and having equipotential points at opposite ends of a series connection comprising said transformer secondary winding and said tuning inductor, with respect to the potential of said anode; and means operable in response to tuning in the higher frequency portion of said range for shorting the turns of said secondary winding whereby said neutralizing capacitor and said tuning inductor operate to derive a voltage from said output circuit and apply it to the input circuit in opposite phase to voltage fed back to the input circuit through the grid-plate interelectrode capacitance of said tube.

3. A high frequency amplifier tunable over a wide high frequency range comprising, in combination, a triode tube having an anode, cathode and control grid, means providing an input circuit for said high frequency amplifier including a coupling transformer having primary and secondary windings disposed coaxially on a ferromagnetic core, said primary winding being substantially uniformly distributed along said core and connected at one end to ground for said amplifier and for signal input at the other end, the major portion of the turns of said secondary winding being positioned adjacent the ground end of said primary winding, means providing a tuning inductor connected between one end of said secondary winding and said control grid, means providing an output circuit for said amplifier connected between said anode and said ground, means connecting said cathode to ground, and a neutralizing capacitor connected from said anode to the other terminal of said secondary winding, the ratio of the capacitance of said neutralizing capacitor to the distributed capacitance between the major portion of said secondary winding and said primary winding being equal to the ratio of the grid-anode capacitance to the grid-cathode capacitance of said amplifier tube, whereby said capacitances form a balanced bridge circuit between said anode and ground and having equipotential points with respect to signal potentials developed on said anode at opposite ends of the series circuit comprising said secondary winding and said tuning inductor.

4. A high frequency amplifier comprising in combination, an electronic amplifier tube having an anode, cathode and control electrode, an input circuit for said amplifier comprising capacitance means effectively connected between a signal input terminal and ground, a tuning inductor effectively connected between the high signal potential side of said capacitance means and said control electrode, means providing a neutralizing circuit for said amplifier including a neutralizing capacitor connected between said anode and the end of said tuning inductor connected to said capacitance means, said neutralizing capacitor and tuning inductor and the control electrode-cathode interelectrode capacitance forming a series resonant circuit between said anode and ground tuned to a frequency whereby the voltage across said control electrode-cathode interelectrode capacitance applies a signal voltage to said control electrode of equal amplitude and opposite phase to signal voltage feedback from the anode to the control electrode through the grid-plate capacitance of said tube.

5. For use in a television receiver, a high frequency amplifier tunable to any one of a plurality of channel frequencies in a lower frequency range between 54 and 88 megacycles or a higher frequency range between 174 and 216 megacycles, comprising a triode amplifier tube having an anode, cathode and control electrode; means providing an input circuit for said high frequency amplifier including a coupling transformer having primary and secondary windings; means connecting one terminal of said primary winding to said cathode and with signal ground for said amplifier; high frequency signal supply means coupled with the other terminal of said primary winding; the major portion of said secondary winding being coupled to said primary winding near the grounded end thereof; means providing a tuning inductance connected between one end of said secondary winding to said control electrode to tune said amplifier input circuit to any one of a plurality of channel frequencies in the lower frequency range between 54 and 88 megacycles; means providing a capacity bridge circuit for neutralizing said high frequency amplifier in said lower frequency range, said means including the distributed capacitance between said secondary winding and said primary winding, the inherent interelectrodal capacitances of said amplifier tube and a neutralizing capacitor connected between said anode and the other end of said secondary winding; means providing a tuning inductance connected between said control grid and said transformer to tune said amplifier input circuit to any one of a plurality of channel frequencies in the upper frequency range between 174 and 216 megacycles and means for short circuiting said secondary winding when tuning over said higher frequency range; said neutralizing capacitor and said last named tuning inductance proportioned to apply a voltage to said control electrode of equal amplitude and opposite phase to the voltage fed back from said anode to the control electrode through the interelectrode capacitance of said tube.

6. For use in a television receiver, a high frequency amplifier tunable to any one of a plurality of channel frequencies in a lower frequency range between 54 and 88 megacycles, or a higher frequency range between 174 and 216 megacycles comprising an electron tube having at least an anode, cathode and control grid, means providing an input circuit for said amplifier comprising a transformer having primary and secondary windings, means providing tuning inductance for tuning said amplifier to any one of a plurality of channels in the lower frequency range extending between 54 and 88 megacycles or the higher frequency range between 174 and 216 megacycles connected between one terminal of said secondary winding and said control grid, means connecting a neutralizing capacitor between the other terminal of said secondary winding and said anode, means connecting said cathode to a terminal of said primary winding and to said secondary winding through the distributed capacitance between said transformer windings, and means for short circuiting said secondary winding simultaneously with tuning to any one of the channels in the frequency range between 174 and 216 megacycles.

7. For use in a television receiver, a high frequency amplifier tunable to any one of a plurality of channel frequencies in a lower frequency range between 54 and 88 megacycles or a higher frequency range between 174 and 216 megacycles comprising an electron tube having at least an anode, cathode and control grid, means providing an input circuit for said amplifier comprising a transformer having primary and secondary windings, means providing tuning inductance for tuning said amplifier to any one of a plurality of channels in the lower frequency range extending between 54 and 88 megacycles or the higher frequency range between 174 and 216 megacycles, connected between one terminal of said secondary winding and said control grid, and means connecting said cathode to a terminal of said primary winding and to said secondary winding through the distributed capacitance between said transformer windings, and means for short circuiting said secondary winding simultaneously with tuning to any one of the channels in the frequency range between 174 and 216 megacycles, and means providing a capacitance bridge circuit for neutralizing said amplifier in said lower range including a capacitor connected between said anode and the other terminal of said secondary winding.

8. A high frequency amplifier tunable over a wide high frequency range comprising in combination, an electron tube having at least an anode, cathode and control grid, means providing an input circuit for said high frequency amplifier including a coupling transformer having primary and secondary windings, means providing tuning inductance for said amplifier connected between a first terminal of said secondary winding and said control grid, means providing an output circuit for said amplifier connected between said anode and ground for said amplifier, means connecting said cathode to a terminal of said primary winding and to said secondary winding through the distributed capacitance between said transformer windings, and a neutralizing capacitor connected from said anode to a second terminal of said secondary winding whereby said neutralizing capacitor and the inherent interelectrode capacities of said tube form a portion of a balanced bridge circuit between said anode and ground.

References Cited in the file of this patent

UNITED STATES PATENTS

| | | |
|---|---|---|
| 1,857,055 | MacDonald | May 3, 1932 |
| 2,226,694 | Buschbeck | Dec. 31, 1940 |
| 2,581,195 | Achenbach | Jan. 1, 1952 |